United States Patent
Cohen

(10) Patent No.: US 12,301,102 B2
(45) Date of Patent: May 13, 2025

(54) POWER FACTOR CORRECTION

(71) Applicant: TEXAS INSTRUMENTS INCORPORATED, Dallas, TX (US)

(72) Inventor: Isaac Cohen, Dix Hills, NY (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 29 days.

(21) Appl. No.: 17/709,141

(22) Filed: Mar. 30, 2022

(65) Prior Publication Data

US 2023/0318446 A1 Oct. 5, 2023

(51) Int. Cl.
*H02M 1/42* (2007.01)
*H02M 1/12* (2006.01)
*H02M 1/00* (2006.01)

(52) U.S. Cl.
CPC ........... *H02M 1/4225* (2013.01); *H02M 1/12* (2013.01); *H02M 1/0009* (2021.05)

(58) Field of Classification Search
CPC .... H02M 1/4225; H02M 1/12; H02M 1/0009; H02M 1/123; H02M 1/126; H02M 1/42; H02M 1/4208; H02M 1/4233; H02M 1/4241; H02M 1/4258; H02M 1/425; H02M 3/155–156; H02M 3/145; H02M 3/158; H02M 3/1582–1588; H02M 2001/4283; H02M 2001/4291; H02M 2003/1552
See application file for complete search history.

(56) References Cited

U.S. PATENT DOCUMENTS

| | | | | |
|---|---|---|---|---|
| 5,367,246 A | * | 11/1994 | Kaiser | H02J 3/1828 |
| | | | | 363/39 |
| 2016/0028304 A1 | * | 1/2016 | O'Day | H02M 1/4233 |
| | | | | 363/89 |
| 2018/0123457 A1 | | 5/2018 | Yaguchi | |
| 2019/0305671 A1 | * | 10/2019 | Matsuura | H02M 1/083 |

FOREIGN PATENT DOCUMENTS

| | | | | |
|---|---|---|---|---|
| CN | 102130581 B | | 4/2013 | |
| CN | 103501555 A | * | 1/2014 | |
| CN | 203734523 U | * | 7/2014 | |
| CN | 109917177 B | | 2/2021 | |
| CN | 112636581 B | * | 12/2021 | H02M 1/4233 |

OTHER PUBLICATIONS

CN 112636581 English Translation (Year: 2021).*
Texas Instruments. UCC28056 6-Pin Single-Phase Transition-Mode PFC Controller. SLUSD37E—Oct. 2017—Revised Nov. 2019. 55 pages.
International Search Report dated Jun. 22, 2023.
Bin Su et al: "Totem-Pole Boost Bridgeless PFC Rectifier With Simple Zero-Current Detection and Full-Range ZVS Operating at the Boundary of DCM/CCM", IEEE Transactions on Power Electronics, Institute of Electrical and Electronics Engineers, USA, vol. 26, No. 2, Feb. 1, 2011 (Feb. 1, 2011), pp. 427-435.

\* cited by examiner

*Primary Examiner* — Bryan R Perez
(74) *Attorney, Agent, or Firm* — Charles F. Koch; Frank D. Cimino

(57) ABSTRACT

A bridgeless power factor correction (PFC) control circuit includes a non-linear current sensor. The non-linear current sensor includes a non-linear shunt, a comparator, and a reference voltage circuit. The non-linear shunt includes a capacitor connection terminal and a ground terminal. The comparator includes a first input, a reference voltage input, and a zero-crossing detector output. The first is input coupled to the capacitor connection terminal. The reference voltage circuit is coupled to the reference voltage input.

17 Claims, 3 Drawing Sheets

POWER FACTOR CORRECTION

BACKGROUND

Electrical power supplies commonly use diode rectifier circuits to convert from alternating current (AC) to direct current (DC). A diode rectifier conducts current only when the input voltage of the rectifier exceeds the output voltage of the rectifier, resulting in a harmonics rich, non-sinusoidal input current and a power factor considerably lower than unity.

Current harmonics and low power factor are detrimental to the utility power distribution system, so many power supplies include power factor correction to reduce input current harmonics. Power factor correction (PFC) refers to a process to attenuate the harmonic content of the current.

Bridgeless PFC circuits omit an input rectifier bridge and thus provide a cost effective and highly efficient power supply solution for a wide variety of products such as server and telecom power equipment, set-top boxes, televisions; displays; etc.

SUMMARY

In one example, a bridgeless power factor correction (PFC) control circuit includes a non-linear current sensor. The non-linear current sensor includes a non-linear shunt, a comparator, and a reference voltage circuit. The non-linear shunt includes a capacitor connection terminal and a ground terminal. The comparator includes a first input, a reference voltage input, and a zero-crossing detector output. The first is input coupled to the capacitor connection terminal. The reference voltage circuit is coupled to the reference voltage input.

In another example, a bridgeless PFC control circuit includes a non-linear current sensor and a comparator. The non-linear current sensor includes a ground terminal and a capacitor connection terminal. The non-linear current sensor is configured to detect current at the capacitor connection terminal. The comparator is coupled to the non-linear current sensor. The comparator is configured to compare an output signal of the non-linear current sensor to a zero-crossing threshold.

In a further example, a bridgeless PFC correction circuit includes a boost inductor, a first switch, a second switch, an output capacitor, a non-linear current sensor, a comparator, and a PFC controller. The first switch is coupled to the boost inductor. The second switch is coupled to the boost inductor. The output capacitor is coupled to the second switch. The non-linear current sensor is coupled between the output capacitor and a ground node. The comparator includes an input and an output. The input is coupled to the non-linear current sensor. The PFC controller includes an input and an output. The input of the PFC controller is coupled to the output of the comparator. The output of the PFC controller is coupled to the first switch and the second switch.

BRIEF DESCRIPTION OF THE DRAWINGS

For a detailed description of various examples, reference will now be made to the accompanying drawings in which.

DETAILED DESCRIPTION

Figure 1:
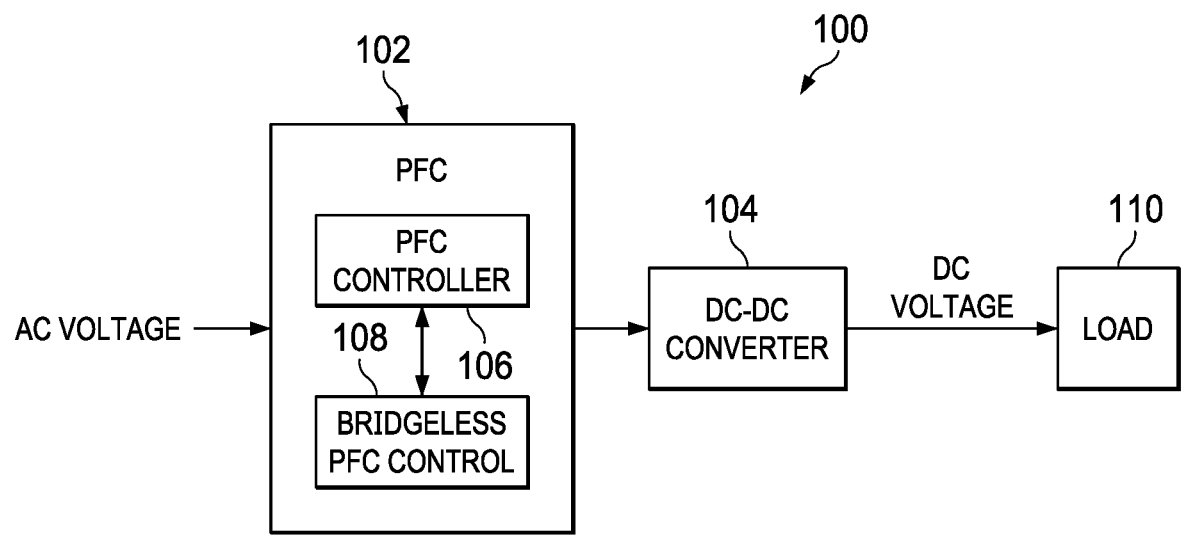
FIG. 1 is a block diagram of an example power supply circuit that includes bridgeless power factor correction (PFC) circuitry with a bridgeless PFC control circuit as described herein.

In a power factor correction (PFC) circuit, support for critical conduction mode (CRM (also referred to as "transition mode")) or discontinuous mode (DCM) with valley switching, requires that the instantaneous current in the inductor or switches be sensed, and that the time of the valley ringing on the switching node be determined. In a bridgeless PFC circuit, neither of these parameters (inductor current, valley ring time) is directly accessible because the inductor is not referenced to the ground of PFC circuit. Hall effect sensors, and other complex circuits, that have been applied to measure the inductor current in a bridgeless PFC add cost and complexity.

The bridgeless PFC control circuits described herein reduce PFC circuit cost and complexity by allowing a PFC controller designed for use with a diode bridge to control a bridgeless PFC circuit. To facilitate application of the PFC controller in the bridgeless PFC circuit, the bridgeless PFC control circuits provide switching node valley detection, cycle-by-cycle current estimation, and switch short-circuit detection for use by the PFC controller. A non-linear current sensor coupled to the output capacitor of the PFC circuit implements the switching node valley detection. A shunt resistor coupled to the non-linear current sensor provides switch short circuit detection. An integrator circuit coupled to the AC voltage source charging the inductor provides the cycle-by-cycle current estimation.

Bridgeless PFC circuits using the bridgeless PFC control circuits described herein may include super-junction (SJ) transistors (rather than more expensive silicon-carbide transistors) in a totem-pole configuration to further reduce cost. When using an SJ transistor totem-pole, turning on one of the transistors when the voltage on the other transistor is very low may result in very high switching losses caused by forced charging of the output capacitance (Coss) of the complementary transistor. This is the principal reason (above and beyond reverse recovery of the body diode) that SJ transistors perform poorly in half bridge, non-ZVS applications. When the current in the transistor acting as boost rectifier drops to zero, its large Coss charges very slowly, so the output voltage can build a negative current in the boost inductor. This negative current causes the switching node voltage to drop to a considerably lower valley value than that achievable with a very fast rectifier. The bridgeless PFC control circuits described herein detect this deep valley, and control switch timing to reduce turn-on losses in the boost transistor (thereby enabling the use of SJ transistors). Accurate detection of the valley is needed for low switching loss operation, and because the interval from the first zero crossing of the inductor current to the valley varies significantly with input and output voltage variations, fixed time delay cannot be used for valley detection. The non-linear current sensor detects the valley based on changes in direction of the inductor current.

FIG. 1 is a block diagram of power supply circuit 100. The power supply circuit 100 includes a bridgeless PFC circuit 102 and a DC-DC converter circuit 104. The bridgeless PFC circuit 102 receives and rectifies AC voltage to generate a DC voltage for use by the DC-DC converter circuit 104. The bridgeless PFC circuit 102 may be a boost PFC circuit. The DC-DC converter circuit 104 converts the DC voltage generated by the bridgeless PFC circuit 102 to a DC voltage suitable for powering the load circuit 110. For example, the bridgeless PFC circuit 102 may convert 120-volt AC to 400-volt DC, and the DC-DC converter circuit 104 may convert the 400-volt DC to 5-volt DC for use by the load circuit 110. The load circuit 110 may be any circuitry powered by the DC-DC converter circuit 104.

The bridgeless PFC circuit 102 includes a PFC controller 106 and a bridgeless PFC control circuit 108. The PFC controller 106 may designed for use with a bridge circuit (e.g., a diode bridge) that rectifies the AC voltage. For example, in one implementation of the bridgeless PFC circuit 102, the PFC controller 106 may be a UCC 28056 integrated circuit produced by Texas Instruments Incorporated. Some implementations of the bridgeless PFC circuit 102 may use a different PFC controller.

The bridgeless PFC control circuit 108 is coupled to the PFC controller 106, and to other components of the bridgeless PFC circuit 102 (switching transistors, output capacitor, etc.) to generate signals provided to the PFC controller 106 for controlling the bridgeless PFC circuit 102. The bridgeless PFC control circuit 108 provides switching node valley detection, cycle-by-cycle current estimation, and switch short-circuit detection for use by the PFC controller 106.

Figure 2:
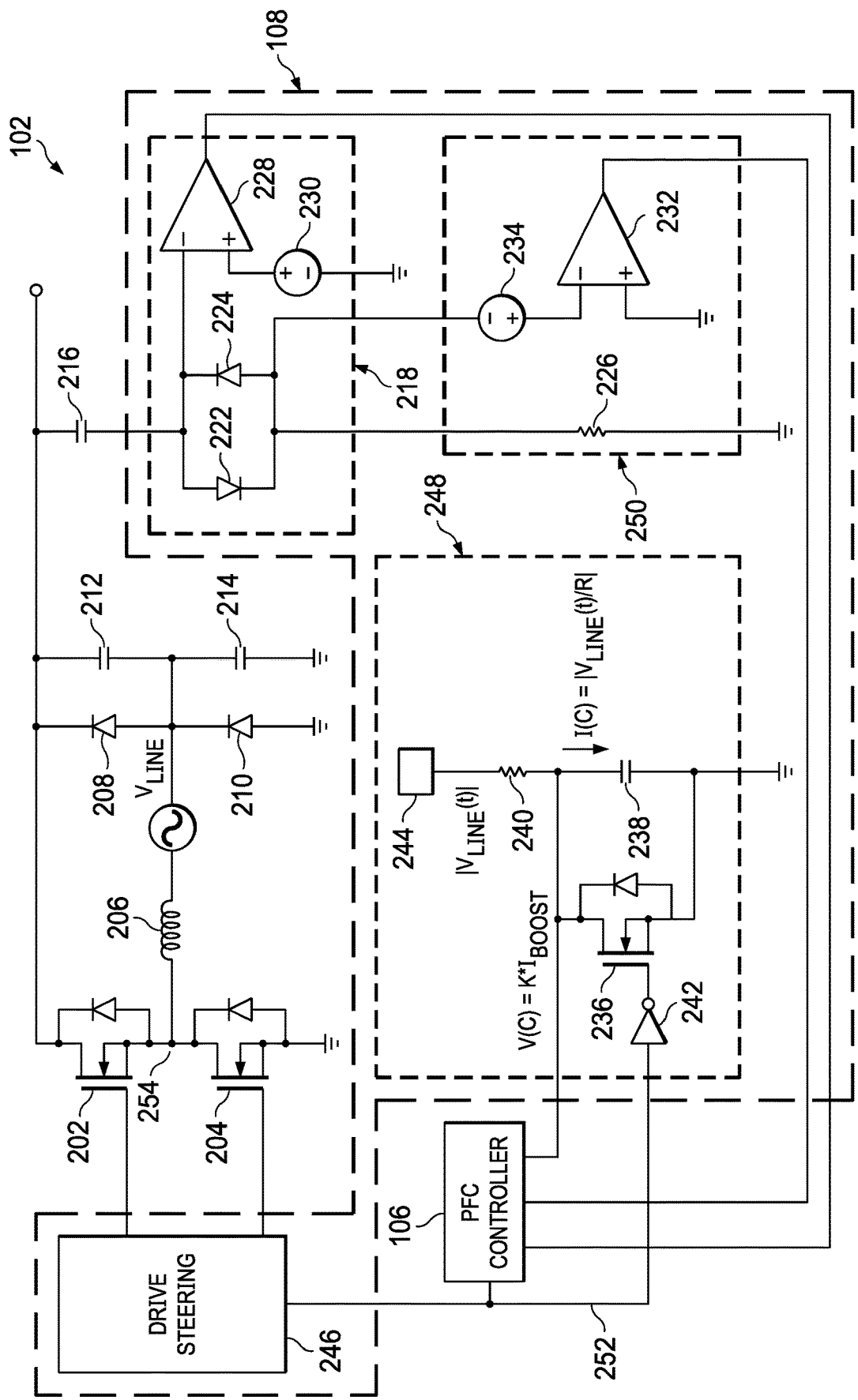
FIG. 2 is a block diagram of an example of the bridgeless PFC circuitry of FIG. 1.

FIG. 2 is a block diagram of an example of the bridgeless PFC circuit 102. The bridgeless PFC circuit 102 includes an inductor 206 (boost inductor), a diode 208, and a diode 210 coupled to AC power. A capacitor 212 is in parallel with the diode 208, and a capacitor 214 is in parallel with the diode 210. In some implementations of the bridgeless PFC circuit 102, the diode 208 and the diode 210 may be implemented using transistors. The transistor 204 and the transistor 202 are coupled to the inductor 206 for charging and discharging. The transistor 202 and the transistor 204 may be SJ NFETs. In some implementations of the bridgeless PFC circuit 102, the transistor 202 may be configured as a diode, or replaced by a diode. The output capacitor 216 is coupled to the transistor 202.

The bridgeless PFC control circuit 108 is coupled to the PFC controller 106. The PFC controller 106 is coupled to and controls the transistor 204, and the transistor 202 in some implementations, based on the signals received from the bridgeless PFC control circuit 108. The bridgeless PFC control circuit 108 includes a non-linear current sensor 218, an integrator circuit 248, and a switch short detection circuit 250. The non-linear current sensor 218 is coupled to a terminal of the output capacitor 216 (to the bottom plate of the output capacitor 216) to detect reversal of current flowing in the inductor 206. The non-linear current sensor 218 includes a diode 222 and a diode 224, a comparator 228, and a reference voltage circuit 230. The diode 222 and the diode 224 may be Schottky diodes. The diode 222 and the diode 224 are connected in anti-parallel fashion to form a non-linear shunt. That is, the anode of the diode 222 is coupled to the cathode of the diode 224 (to form a capacitor connection terminal) and to the output capacitor 216. The cathode of the diode 222 is coupled to the anode of the diode 224 (to form a ground terminal), and to a ground node.

The voltage across the diode 222 and the diode 224 provides an indication of when the current in the inductor 206 changes direction. A first input (e.g., the inverting input) of the comparator 228 is coupled to anode of the diode 222 and the cathode of the diode 224. A second (reference voltage) input (e.g., the non-inverting input) of the comparator 228 is coupled to the reference voltage circuit 230. The output voltage of the reference voltage circuit 230 sets a threshold for zero current detection. For example, when the voltage across the diode 222 and the diode 224 falls below the threshold, a change from positive to negative current flow is detected, and when the voltage across the diode 222 and the diode 224 rises above the threshold, a change from negative to positive (or zero) current is detected. The output (zero-crossing detector output) of the comparator 228 is coupled to an input (a zero-crossing detection input) of the PFC controller 106 to provide the PFC controller 106 with zero crossing detection information. The PFC controller 106 may initiate charging of the inductor 206 (via control of the transistor 204) based on the zero-crossing information provided by the non-linear current sensor 218.

Figure 3:
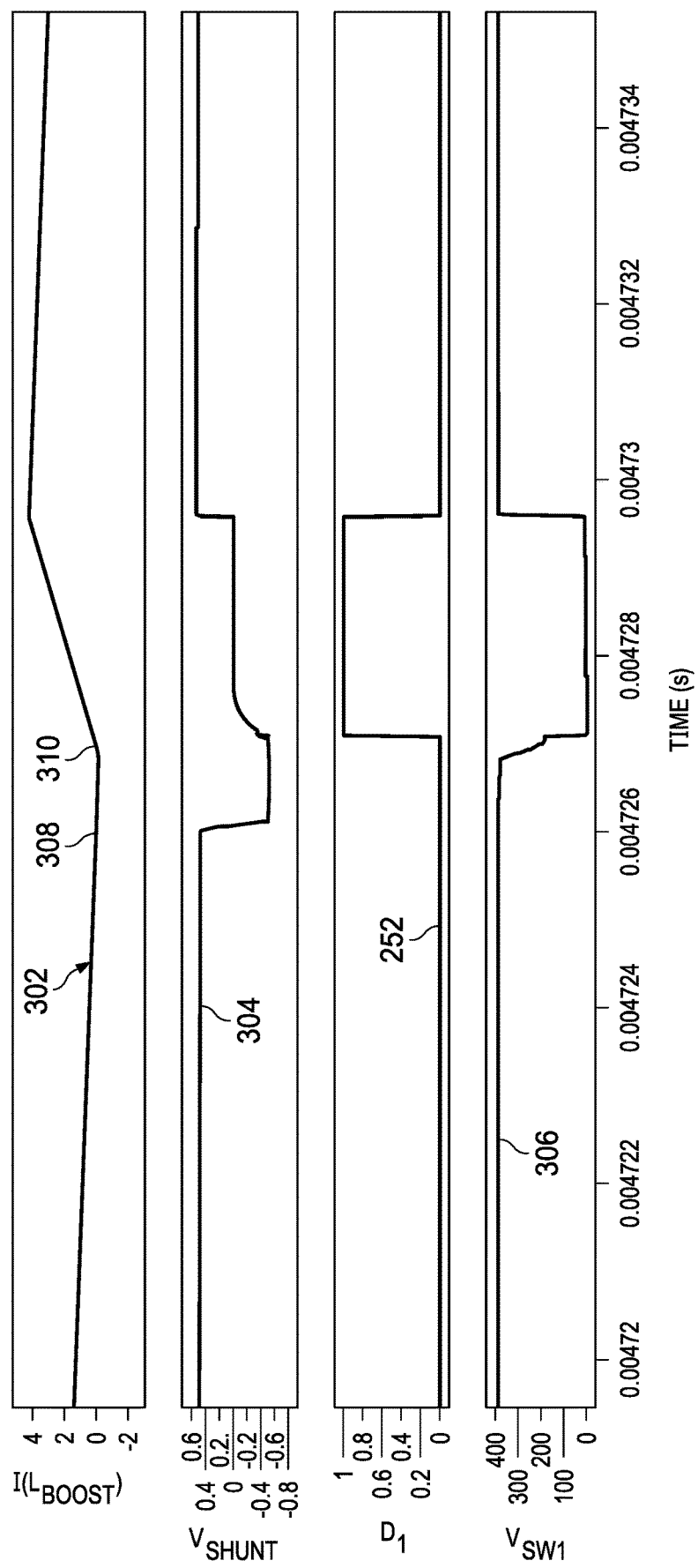
FIG. 3 is timing diagram showing example signals produced by operation of a non-linear current sensor to enable valley switching in the bridgeless PFC circuitry of FIG. 2.

FIG. 3 is timing diagram showing operation of the bridgeless PFC control circuit 108 with valley detection. FIG. 3 shows inductor current 302, the voltage 304 across the diodes 222 and 224, the boost on signal 252 provided by the PFC controller 106 to control the transistor 204, and the voltage 306 at the switching node 254. In FIG. 3, prior to time 310, the transistor 204 is off, and the inductor 206 discharges through the transistor 202 (e.g., through the body diode or the channel of the transistor 202). When the inductor current 302 reverses direction (crosses zero) at time 308, the voltage 304 across the diodes 202 and 204 goes from positive to negative. At time 310, the voltage at the switching node 254 is at the valley, the inductor current 302 returns to zero, and the voltage 304 across the diodes 222 and 224 rises to zero. The transition of the voltage 304 across the diodes 222 and 224 from negative to zero is detected by the comparator 228 and the output of the comparator 228 is provided to the PFC controller 106. The PFC controller 106 initiates a boost cycle (activates the boost on signal 252) at its transistor drive output responsive to the signal received from the comparator 228 to pull the switching node 254 to ground and charge the inductor 206. Thus, detection of the transition of the voltage 304 across the diodes 222 and 224 from negative to zero by the bridgeless PFC control circuit 108 enables valley switching in the bridgeless PFC circuit 102 for all operating conditions.

Returning to FIG. 2, the switch short detection circuit 250 detects potential faults in switches (the transistors 202 or 204, or diodes 208 or 210) of the bridgeless PFC circuit 102. The switch short detection circuit 250 includes a resistor 226, a reference voltage circuit 234, and a comparator 232. The resistor 226 connects the diode 222 and the 224 to a ground node. A first terminal of the resistor 226 is coupled to the cathode of the diode 222 and the anode of the 224. A second terminal of the resistor 226 is coupled to ground. The resistance of the resistor 226 is relatively low. For example, the resistor 226 may have resistance in a range of 10 milliohms (mΩ) to 100 mΩ in some implementations. The first terminal of the resistor 226 is coupled to the reference voltage circuit 234. A first input (inverting input) of the comparator 232 is coupled to the reference voltage circuit 234, and a second input (non-inverting input) of the comparator 232 is coupled to ground. The output of the comparator 232 is coupled to an input (e.g., an over voltage sense input) of the PFC controller 106.

When the bridgeless PFC circuit 102 is operating normally, the voltage across the resistor 226 is very small. However, if one of the switches (the transistors 202 or 204, or diodes 208 or 210) fails as a short circuit, then the output capacitor 216 will be discharged though the short, and large current will flow through the resistor 226 increasing the voltage dropped across the resistor 226. The comparator 232 detects the increase in voltage drop across the resistor 226, and provides a fault signal the PFC controller 106. The PFC controller 106 may disable switching of the transistor 204 and the transistor 202 responsive to the fault signal.

The integrator circuit 248 estimates the current flowing in the inductor 206 based on AC line voltage, and may also be referred to as an inductor current estimation circuit. The integrator circuit 248 includes a transistor 236, a capacitor 238, a resistor 240, an inverter 242, and a rectifier circuit 244. A first terminal of the resistor 240 is coupled to the rectifier circuit 244, and a second terminal of the resistor 240 is coupled to a first terminal of the capacitor 238 and a drain of the transistor 236. A second terminal of the capacitor 238 is coupled to ground. A source terminal of the transistor 236 is coupled to ground. A control terminal (gate terminal) of the transistor 236 is coupled to the output of the PFC controller 106 via the inverter 242. The drain terminal of the transistor 236 (and the top plate of the capacitor 238) is coupled to a control input of the PFC controller 106. The transistor 236 may be an NFET.

The rectifier circuit 244 rectifies the AC line voltage to produce the absolute value thereof (|Vline(t)|). In input terminal of the rectifier circuit 244 is coupled to an AC power terminal. While the inductor 206 is being charged, the capacitor 238 is charged, through the resistor 240. The voltage across the capacitor 238 (the voltage stored on the capacitor 238) is the time integral of the voltage charging the inductor 206, and is therefore representative of the current flowing in the inductor 206. When the inductor 206 is being discharged, the capacitor 238 is discharged by the transistor 236. The voltage across the capacitor 238 is provided to the PFC controller 106. The PFC controller 106 may compare the voltage across the capacitor 238 to a threshold. If the voltage exceeds the threshold (indicating that the current flowing in the inductor 206 is too great), then the PFC controller 106 may disable switching of the transistor 204 and the transistor 202.

In some implementations of the bridgeless PFC circuit 102, portions of the bridgeless PFC control circuit 108 may be provided as components of an integrated circuit.

Implementations of the bridgeless PFC circuit 102 that actively control the transistor 202 may include the drive steering circuit 246. The drive steering circuit 246 includes an input coupled to the PFC controller 106, a first output coupled to the gate of the transistor 204, and a second output coupled to the gate of transistor 202. The drive steering circuit 246 may alternately route the output (the gate control signal (boost on signal 252)) received from the PFC controller 106 to the transistor 202 or the transistor 204. For example, the drive steering circuit 246 may route drive pulses received from the PFC controller 106 to the transistor 204 during the positive portion of the AC cycle, and route drive pulses received from the PFC controller 106 to the transistor 202 during the negative portion of the AC cycle.

In implementations of the bridgeless PFC circuit 102 that do not actively control the transistor 202, the output of the 106 may coupled to the gate of the 204, while the 202 is connected as a diode, or replaced by a diode.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

While the use of particular transistors is described herein, other transistors (or equivalent devices) may be used instead. For example, a p-channel field effect transistor ("PFET") may be used in place of an n-channel field effect transistor ("NFET") with little or no changes to the circuit. Furthermore, other types of transistors may be used (such as bipolar junction transistors (BJTs)).

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as transistors, unless otherwise stated, are generally representative of any one or more transistors coupled in parallel to provide desired channel width or emitter size.

Modifications are possible in the described embodiments, and other embodiments are possible, within the scope of the claims.

What is claimed is:

1. A circuit, comprising:
   a non-linear current sensor including:
   a non-linear shunt including a capacitor connection terminal and a ground terminal,
   wherein the non-linear shunt includes:
   a first diode including:
   a cathode coupled to the capacitor connection terminal; and
   an anode coupled to the ground terminal; and
   a second diode including:
   an anode coupled to the capacitor connection terminal; and
   a cathode coupled to the ground terminal;
   a comparator including:
   a first input coupled to the capacitor connection terminal;
   a reference voltage input; and
   a zero-crossing detector output configured to be coupled to a control circuit; and a reference voltage circuit coupled to the reference voltage input; and
an inductor current estimation circuit, including:
a rectifier circuit including:
an AC power input; and
an output;
a resistor including:
a first terminal coupled to the output of the rectifier circuit; and
a second terminal configured to be coupled to the control circuit; and
a capacitor coupled in series with the resistor, the capacitor including:
a first terminal coupled to the second terminal of the resistor; and
a second terminal coupled to a ground terminal.

2. The circuit of claim 1, further comprising:
a resistor coupled between the ground terminal of the non-linear shunt and a ground terminal.

3. The circuit of claim 2, wherein:
the comparator is a first comparator;
the reference voltage circuit is a first reference voltage circuit; and
the circuit further comprises:
a second reference voltage circuit coupled to the resistor; and
a second comparator including:
a first input coupled to the ground terminal;
a second input coupled to the second reference voltage circuit; and
a switch disable output.

4. The circuit of claim 1, further comprising:
a switch including:
a first terminal coupled to the first terminal of the capacitor;
a second terminal coupled to the second terminal of the capacitor; and
a control terminal; and
an inverter including an output coupled to the control terminal, and an input configured to be coupled to an output of the control circuit.

5. The circuit of claim 4, further comprising:
a drive steering circuit including:
an input coupled to the control terminal;
a first transistor control output; and
a second transistor control output.

6. A circuit comprising:
a shunt including a ground terminal and a capacitor connection terminal, the shunt configured to detect current at the capacitor connection terminal, the shunt including a first diode coupled in anti-parallel with a second diode;
a comparator including a first input and a second input, wherein:
the first input of the comparator is coupled to the capacitor connection terminal of the shunt;
the second input of the comparator is coupled to a voltage reference; and
the comparator is configured to compare an output signal of the shunt to a zero-crossing threshold associated with the voltage reference; and
an inductor current estimation circuit, including:
a rectifier circuit coupled to an AC power terminal; and
an integrator circuit coupled to the rectifier circuit, the integrator circuit configured to generate a voltage representative of a current flowing in a boost inductor.

7. The circuit of claim 6, wherein:
the first diode includes:
a cathode coupled to a first terminal of a non-linear current sensor; and
an anode coupled to a second terminal of the non-linear current sensor; and
the second diode includes:
an anode coupled to the first terminal of the non-linear current sensor; and
a cathode coupled to the second terminal of the non-linear current sensor.

8. The circuit of claim 6, wherein:
the shunt and the comparator comprise a non-linear current sensor; and
the circuit further comprising: a resistor coupled between the non-linear current sensor and a ground terminal.

9. The circuit of claim 8, wherein:
the comparator is a first comparator; and
the circuit further includes:
a second comparator coupled to the resistor, and configured to detect a short in a switch.

10. The circuit of claim 6, wherein the inductor current estimation circuit includes:
a capacitor configured to store the voltage representative of a current flowing in a boost inductor; and
a switch coupled to the capacitor, and configured to discharge the capacitor when the boost inductor is discharged.

11. The circuit of claim 10, further comprising:
a drive steering circuit configured to switch a gate control signal to a first transistor or a second transistor coupled to the boost inductor.

12. A circuit, comprising:
a boost inductor;
a first switch coupled to the boost inductor;
a second switch coupled to the boost inductor;
an output capacitor coupled to the second switch;
a non-linear current sensor including:
a first terminal coupled to the output capacitor;
a second terminal coupled to a ground terminal; and
a first comparator including:
a first input coupled to the first terminal of the non-linear current sensor;
a second input coupled to a voltage reference; and
an output of the non-linear current sensor;
a comparator including:
an input coupled to the non-linear current sensor; and
an output; and
a PFC controller including:
a first input coupled to the output of the comparator;
a second input coupled to the output of the non-linear current sensor; and
an output coupled to the first switch and the second switch.

13. The circuit of claim 12, wherein:
the non-linear current sensor includes:
a first diode including:
a cathode coupled to the first terminal of the non-linear current sensor; and
an anode coupled to the second terminal of the non-linear current sensor; and
a second diode including:
an anode coupled to the first terminal of the non-linear current sensor; and
a cathode coupled to the second terminal of the non-linear current sensor.

14. The circuit of claim 13, wherein:
the circuit includes:
 a resistor coupled between the non-linear current sensor and the ground terminal; and
 a second comparator including:
  an input coupled to the resistor; and
  an output coupled to the second input of the PFC controller.

15. The circuit of claim 12, wherein:
the circuit includes:
 an inductor current estimation circuit, including:
  a rectifier circuit including
   an input coupled to the boost inductor; and
   an output;
  a resistor including:
   a first terminal coupled to the output of the rectifier circuit; and
   a second terminal coupled to the second input of the PFC controller; and
  a capacitor including:
   a first terminal coupled to the second terminal of the resistor; and
   a second terminal coupled to the ground terminal.

16. The circuit of claim 15, further comprising:
a third switch including:
 a first terminal coupled to the first terminal of the capacitor;
 a second terminal coupled to the second terminal of the capacitor; and
 a control terminal coupled to the output of the PFC controller.

17. The circuit of claim 15, further comprising:
a drive steering circuit including:
 an input coupled to the output of the PFC controller;
 a first output coupled to the first switch; and
 a second output coupled to the second switch.

* * * * *